United States Patent [19]

Albaugh et al.

[11] Patent Number: 4,641,105
[45] Date of Patent: Feb. 3, 1987

[54] APPARATUS AND METHOD FOR NOISE REDUCTION IN A LINEAR AMPLIFIER

[75] Inventors: Neil P. Albaugh; Gordon R. Kane, both of Tucson, Ariz.

[73] Assignee: Burr-Brown Corporation, Tucson, Ariz.

[21] Appl. No.: 784,992

[22] Filed: Oct. 7, 1985

[51] Int. Cl.[4] ............................................. H03F 3/45
[52] U.S. Cl. ....................................... 330/9; 330/260
[58] Field of Search ........................... 330/9, 252, 260

[56] References Cited
U.S. PATENT DOCUMENTS
4,450,368  5/1984  Spence .................................... 330/9

Primary Examiner—Gene Wan
Attorney, Agent, or Firm—Harry M. Weiss

[57] ABSTRACT

In a circuit including a differential amplifier, a switching device is coupled to the input terminals of the differential amplifier for periodically applying signals thereto. A second switching device is coupled to the output terminals of the differential amplifier and is synchronized with the switching device coupled to the input terminal. By providing an output signal that is constructed from signals amplified in an inverted and non-inverted mode of the differential amplifier, sources of noise and drift-related errors can be minimized.

13 Claims, 3 Drawing Figures

APPARATUS AND METHOD FOR NOISE REDUCTION IN A LINEAR AMPLIFIER

BACKGROUND OF THE INVENTION

1. Field of the Invention

This invention relates generally to linear differential amplifier circuits and, more particularly, to the reduction of input offset voltage and noise in the linear differential amplifier circuits.

2. Discussion of the Related Art

An important consideration in the design and use of linear differential amplifiers has been the noise generated within the amplifying device itself. This noise can take the form of "popcorn" noise or can be noise caused by aging, temperature dependence, or other phenomenon resulting in the instability of the characteristics of the amplifying circuit. In order to reduce the noise and more particularly, to reduce the inaccuracies in an amplifying device resulting from drift or aging, it has been known in the past to convert a low frequency input signal of the linear amplifier to a relatively rapid periodic signal and to reconvert the periodic signal to a low frequency signal at the output terminal of the amplifying device. This type of amplifier, referred to as a chopper-stabilized amplifier, is particularly effective in reducing the long term drift features of the amplifying device. The increase in amplifier stability is the result of operating the amplifying device in a relatively linear dynamic range, the dynamic range remaining linear and stable even though the steady operating characteristics can change.

Chopper-stablized amplifiers suffer from chopper-related noise introduced by interrupting the input signal's full amplitude. Compensation for offset voltages can be accomplished by auto-zero techniques in which a feedback circuit supplies an appropriate signal to the amplifier input terminal to compensate for the output signal component resulting from the offset voltage. This technique is relatively complex and is expensive to implement.

The use of a differential amplifier is an effort to balance certain characteristics of the amplifier device. Appreciable effort in the design of operational differential amplifier has been undertaken to provide electronic compensation for component characteristics of the amplifying device.

A need has therefore been felt for an amplifier circuit that can provide normal linear amplifier operation while reducing various types of noise normally associated with the linear amplifier.

SUMMARY

It is therefore an object of the present invention to provide for an improved differential operational amplifier circuit.

It is another object of the present invention to provide a synchronized modulation signal for the input and output terminals of a linear differential amplifier.

It is a more particular object of the present invention to use a periodic switching mechanism to reduce noise in a linear differential amplifier.

It is another particular object of the present invention to provide for a synchronized switching element at the input terminals of a linear amplifier and at the output terminals of the linear differential amplifier, the synchronized switching elements reducing noise, offset voltage and drift.

It is still another particular object of the present invention to provide synchronized switching apparatus at input and at output terminals of an operational amplifier to interrupt and restore a low frequency signal without inter-modulation products found in chopper-stablized amplifiers.

These and other objects are accomplished, according to the present invention, by providing a differential amplifier with a switching element at the input terminals and a switching element, synchronized with the input terminals switching element, at the output terminals. The input switching element alternatively applies an input signal to the positive and negative input terminals of the differential amplifier. The output switching element alternatively applies the signals from the output signal and inverted output signal terminals of the differential amplifier to an output terminal of the circuit. The synchronized switching is arranged so that a signal, applied to the input terminal of the circuit, is applied to the negative input terminal of the amplifier, produces a signal at the output signal terminal of the differential amplifier, and is applied to the output terminal of the circuit. On alternate cycles, the input signal is applied to the positive input terminal of the differential amplifier while the resulting signal applied to the inverted output signal terminal of the differential amplifier and is applied to the output terminal of the circuit. This switching arrangement can be applied both to the differential amplifier that has a large amount of negative feedback as occurs when configured as an operational amplifier, or to the differential amplifier operating simply as a linear amplifying element. With the linear amplifying circuit, an inverted and non-inverted input signal is applied to the differential amplifier.

These and other features of the invention will be understood upon reading of the following description along with the drawings.

OPERATION OF THE PREFERRED EMBODIMENT

Detailed Description of the Figures

Figure 1:
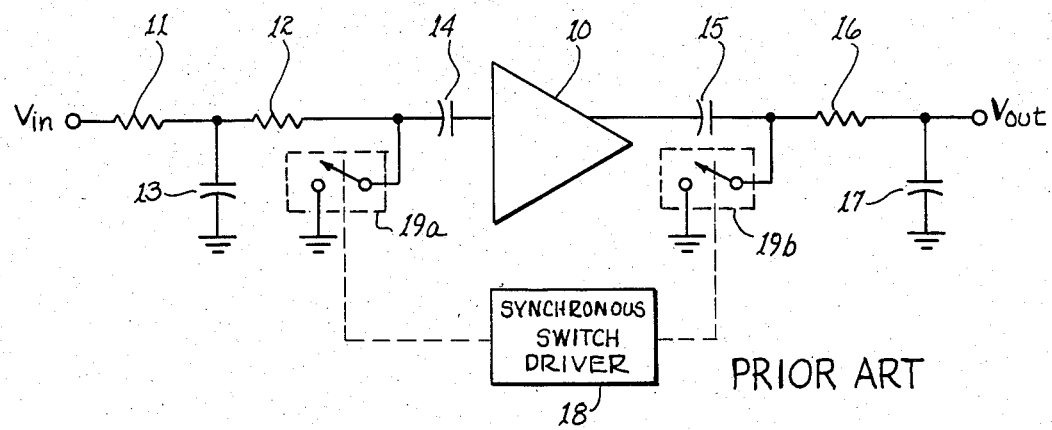
FIG. 1 is a circuit block diagram of an amplifier with chopper-stablization.

Referring to FIG. 1, the input signal terminal, $V_{in}$, is coupled to one terminal of resistor 11. A second terminal of resistor 11 is coupled through capacitor 13 to the ground potential and to a first terminal of resistor 12. A second terminal of resistor 12 is coupled through capacitor 14 to an input terminal of differential amplifier 10 and to a first terminal of switch 19a. A second terminal of switch 19a is coupled to the ground potential. An output terminal of differential amplifier 10 is coupled through capacitor 15 to a first terminal of resitor 15 and to a first terminal of switch 19b. A second terminal of resistor 16 is coupled to the output terminal of the circuit, $V_{out}$, and is coupled through capacitor 17 to the ground potential. A second terminal of switch 19b is coupled to the ground potential. The switches 19a and 19b are driven in synchronization to apply the input and output terminals to a ground potential in a synchronized manner by synchronous switch driver 18.

Figure 2:
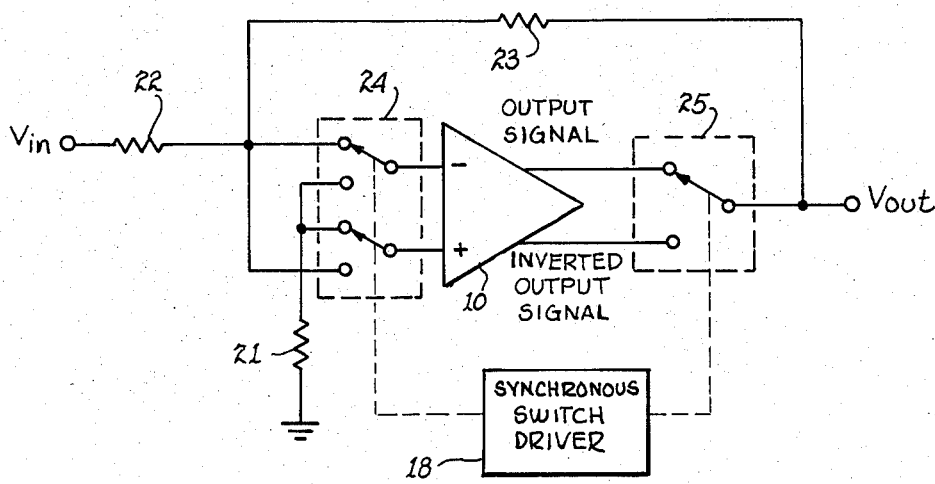
FIG. 2 is a circuit block diagram of a feedback differential amplifier with switching apparatus utilized according to the present invention.

Referring next to FIG. 2, and input signal is coupled to the $V_{in}$ terminal and is thus coupled to a first terminal of resistor 22. A second terminal of resistor 22 is coupled through resistor 23 to the output terminal of the circuit having the signal, $V_{out}$, and to a first terminal of switch 24 and to a fourth terminal of switch 24. A second and a third terminal of switch 24 are coupled through resistor to a ground potential. One output terminal of switch 24 is coupled to a negative terminal of differential amplifier 10, while a second output terminal of switch 24 is coupled to a positive input terminal of differential amplifier 10. The output signal terminal of differential amplifier 10 is coupled to a first input terminal of switch 25, while an inverted output signal terminal of differential amplifier 10 is coupled to a second input terminal of switch 25. An output terminal of switch 25 is coupled to the circuit output terminal having the signal, $V_{out}$. Switches 24 and 25 are driven by synchronous switch driver 18 to apply the input signal to a first terminal of differential amplifier 10 and, on alternative cycles, to the second terminal of the differential amplifier while applying the output signal for the differential amplifier terminal corresponding to the input signal to the $V_{out}$ terminal.

Figure 3:
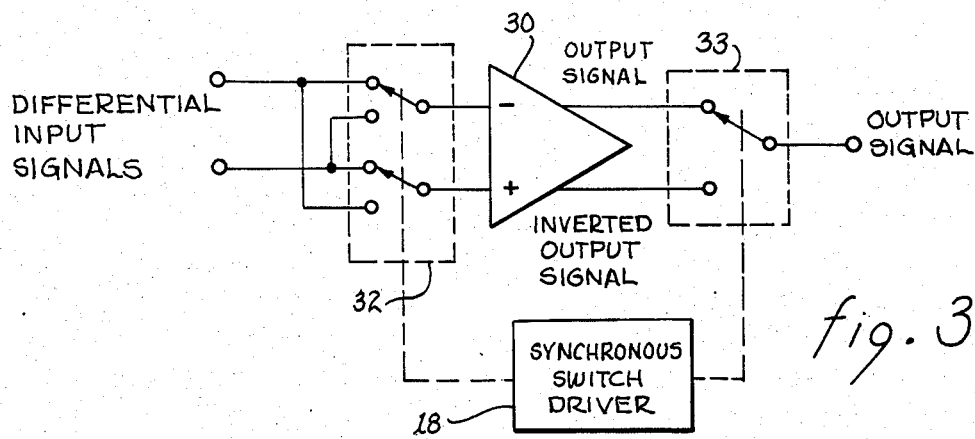
FIG. 3 is a circuit block diagram of a differential instrumentation amplifier utilizing the switching technique of the present invention.

Referring now to FIG. 3, an inverted input signal is applied to a first and a fourth terminal of switch 32. A non-inverted input signal or normal input signal is applied to terminals 2 and 3 of switch 32. A first output terminal of switch 32 is coupled to a negative input terminal of differential amplifier 10, while a second output terminal of switch 32 is applied to a positive terminal of instrumentation amplifier 30. A positive output terminal of instrumentation amplifier 30 is coupled to a first input terminal of switch 33, while a negative output terminal of differential amplifier 10 is coupled to a second input terminal of switch 32. An output terminal of switch 33 is coupled to the output signal terminal. The inverted input signal is applied to one input terminal, while the non-inverted input signal is applied to the second input terminal every other cycle for the switch. During alternative periods, the signals applied to the input terminals are reversed by switch 32. The output switch 33 is synchronized, so that the amplified inverted input signal is always applied to the output terminal, becoming the output signal.

Operation of the Preferred Embodiment

Referring now to FIG. 2 and FIG. 3, it will be seen that the input signals are applied alternatively to the inverting (relative to the output signal) input or (−) terminal and to the non-inverting (relative to the output signal) input or (+) terminal of the differential amplifier 10. When the input signal is applied to the inverting input terminal of differential amplifier 10, the output signal terminal of differential amplifier 10 is coupled to the output circuit terminal. Similarly, when the input signal is coupled to the non-inverting input terminal of differential amplifier 10, the inverted output signal terminal of the differential amplifier 10 is coupled to the output terminal of the circuit. The non-inverting input terminal amplifies an input signal to produce the inverted output signal, thereby maintaining negative feedback. In this manner, depending on the characteristics of the differential amplifier, there is generally no difference to be observed at the output signal terminal during the switching. This stabilization technique is to be contrasted with the technique illustrated in FIG. 1 wherein the carrier frequency, at full signal amplitude, must be demodulated and filtered from the differential amplifier output signal. In fact, minor transient conditions, resulting from the switching of the elements in differential amplifier 10, can be observed, but these conditions have proven to be insignificant. On the other hand, what has been observed is a dramatic decrease in the input offset voltage, noise temperature drift phenomena, and the "popcorn" noise component (the popcorn noise being an instantaneous offset voltage that appears spontaneously during the use of a single amplifying mode). The common mode rejection ration and the power supply rejection ratio are similarly found to increase. It is observed that the popcorn noise has an increasing low frequency signal spectrum. The switching elements of the present invention appear to move the frequencies experienced during the operation of the channels of the differential amplifier 10 into a range where the resulting spontaneous noise is minimized. In addition, the offset voltage is inverted during each ½ cycle so that this error component can be averaged to a zero value.

Referring to FIG. 3, the use of a linear amplifier 10 in an instrumentation amplifying configuration is shown. An inverted input signal and a normal or noninverted input signal are available for application to the instrumentation amplifier. It will be clear, however, that if one of these signals is not available, then the configuration similar to that shown for the differential amplifier 10 of FIG. 2 can be used and the resulting noise can be reduced.

The foregoing description is included to illustrate the operation of the preferred embodiment and is not meant to limit the scope of the invention. The scope of the invention is to be limited only by the following claims. From the foregoing description many variations will be apparent to one skilled in the art that would yet be encompassed by the spirit and scope of the invention.

What is claimed is:

1. An amplifying circuit comprising:
   a differential amplifier;
   an input switch for applying an input signal to a first terminal of said amplifier during a first period and for applying said input signal to a second terminal of said differential amplifier during a second period, said input switch passing both D.C. components and A.C. components substantially without attenuation; and
   output switch, said output switch applying a second output terminal of said differential amplifier to an output terminal during a first period and for applying the output signal of a first output terminal of said amplifier to an output terminal during said second period, said output switch passing both D.C. components and A.C. components substantially without attenuation.

2. The amplifying circuit of claim 1 further including a resistor coupled between an output terminal of said output switch and an input terminal of said input switch for providing a feedback circuit.

3. The amplifying circuit of claim 1 wherein an inverted input signal is applied to a terminal associated with a signal for an output terminal, while a non-inverted input signal provides a signal to the input terminal not associated with an output signal.

4. The method of minimizing noise and drift-related errors in a differential amplifier comprising the steps of:
providing an input signal;
alternatively applying said input signal to inverting and non-inverting input terminals of said differential amplifier during pre-determined alternate intervals substantially without and A.C. or D.C. attenuation of said input signal; and thereafter
providing an output signal comprised of alternately processing a non-inverted output signal and an inverted output signal during pre-determined alternate intervals.

5. The method of minimizing noise in a differential amplifier of claim 4 wherein said pre-determined alternate intervals for processing said input signal and said pre-determined alternate intervals for processing said output signal are synchronized and substantially the same.

6. The method of minimizing noise in a differential amplifier of claim 4 further including the step of providing a feedback path between said input signal and said output signal.

7. The method of minimizing noise in a differential amplifier of claim 6 further including the step of applying said output signal and said inverted output signal to a device output terminal during said pre-determined alternate intervals.

8. An amplifier circuit for minimizing selected noise and error signals comprising:
a differential amplifier;
input signal means for alternately applying an input signal and an inverted input signal to said differential amplifier substantially without attenuation of A.C. or D.C. components of said input signal and said inverted input signal; and
output signal means for alternatively applying output signal and an inverted out signal to a circuit output terminal substantially without attenuation of A.C. or D.C. components of said output signal and said inverted output signal, said input signal means and said output signal means operating substantially simultaneously.

9. The amplifier circuit of claim 8 wherein said input signal means and said output signal means are comprised of synchronized switching circuits.

10. The amplifier circuit of claim 8 further including feedback means between said output signal and said input signal.

11. An amplifier circuit comprising:
differential amplifier means;
input signal means for receiving an input signal into said amplifier circuit;
input switching means for coupling said input signal means to non-inverted input terminal and inverted input terminal of said differential amplifier, said input switching means passing both A.C. and D.C. components of an input signal substantially without attenuation;
output signal means for presenting an output signal from said amplifier circuit; and
output switching means for coupling said output signal means to non-inverted output terminal and inverted output terminal of said differential amplfier, said output switching means passing both A.C. and D.C. components of an output signal substantially without attenuation.

12. The amplifier circuit of claim 11 wherein said switching means includes a first switch means and second switch means, said first and said second switch means driven in a synchronous manner.

13. The amplifier circuit of claim 12 further comprising:
synchronization means for synchronizing said input switching means and said output switching means whereby
said input signal means is coupled to said non-inverted input terminal of said differential amplifier at the same time as said output signal means is coupled to said non-inverted output terminal of said differential amplifier, and
said input signal means is coupled to said inverted input terminal of said differential amplifier at the same time as said output signal means is coupled to said inverted output terminal of said differential amplifier.

* * * * *